United States Patent
Isaac et al.

(10) Patent No.: US 7,620,379 B2
(45) Date of Patent: Nov. 17, 2009

(54) RADIO FREQUENCY TUNER

(75) Inventors: Ali Isaac, Bristol (GB); Nicholas Paul Cowley, Wiltshire (GB); David Albert Sawyer, Wiltshire (GB)

(73) Assignee: Intel Corporation, Santa Clara, CA (US)

( * ) Notice: Subject to any disclaimer, the term of this patent is extended or adjusted under 35 U.S.C. 154(b) by 338 days.

(21) Appl. No.: 11/439,537

(22) Filed: May 24, 2006

(65) Prior Publication Data
US 2006/0281431 A1    Dec. 14, 2006

(30) Foreign Application Priority Data
Jun. 8, 2005    (GB)    ................................ 0511569.6

(51) Int. Cl.
*H04B 1/18* (2006.01)
*H04B 1/16* (2006.01)

(52) U.S. Cl. .................. 455/130; 455/180.4; 455/191.1; 455/339; 348/731

(58) Field of Classification Search .............. 455/67.11, 455/67.13, 67.14, 130–139, 179.1–184.1, 455/188.1–191.2, 226.1–227, 303–307, 333, 455/339–343; 348/725, 731, 735; 327/551–559
See application file for complete search history.

(56) References Cited

U.S. PATENT DOCUMENTS

| | | | | |
|---|---|---|---|---|
| 5,914,633 | A * | 6/1999 | Comino et al. | 327/553 |
| 6,125,269 | A * | 9/2000 | Brekelmans | 455/180.1 |
| 6,438,361 | B1 * | 8/2002 | Chong et al. | 455/188.1 |
| 6,954,115 | B2 * | 10/2005 | Wong | 333/17.1 |
| 7,095,454 | B2 * | 8/2006 | Waight et al. | 348/731 |
| 7,119,834 | B2 * | 10/2006 | Englmeier | 348/192 |
| 7,183,880 | B2 * | 2/2007 | Kamata et al. | 333/174 |
| 7,184,733 | B2 * | 2/2007 | Asayama et al. | 455/260 |
| 7,336,939 | B2 * | 2/2008 | Gomez | 455/307 |
| 7,345,490 | B2 * | 3/2008 | Ibrahim et al. | 324/616 |
| 7,423,699 | B2 * | 9/2008 | Vorenkamp et al. | 348/726 |
| 2004/0070693 | A1 | 4/2004 | Suzuki | |
| 2004/0116096 | A1 * | 6/2004 | Shen | 455/323 |
| 2004/0125240 | A1 * | 7/2004 | Stikvoort et al. | 348/731 |
| 2004/0212447 | A1 * | 10/2004 | Nystrom et al. | 333/17.1 |
| 2006/0154636 | A1 * | 7/2006 | Shah et al. | 455/290 |
| 2006/0270374 | A1 * | 11/2006 | Lester et al. | 455/307 |
| 2007/0229716 | A1 * | 10/2007 | Utsunomiya et al. | 348/731 |

FOREIGN PATENT DOCUMENTS

EP    1 182 778 A1    2/2002

* cited by examiner

*Primary Examiner*—Simon D Nguyen
(74) *Attorney, Agent, or Firm*—Blakely, Sokoloff, Taylor & Zafman LLP

(57) ABSTRACT

A radio frequency tuner comprises one or more tracking filters ahead of at least one frequency changer. A controller has a filter alignment mode and a reception mode. Each filter has one or more resonant networks comprising an inductance and a switched capacitor network which is digitally controlled for selecting the network resonant frequency. In the alignment mode, the controller determines the difference between the nominal and actual capacitances of the network for achieving a known resonant frequency in order to determine a correction factor for the capacitor network. The correction factor is then used during normal reception by the tuner.

18 Claims, 6 Drawing Sheets

RADIO FREQUENCY TUNER

TECHNICAL FIELD

The present invention relates to a radio frequency tuner. Such a tuner may be used, for example, for receiving terrestrial broadcast television signals and may be of the single conversion type. However, such a tuner may also be used for other applications, such as receiving audio or data signals, may be used with other distributions systems, such as satellite aerial systems or cable distribution networks, or may be of other architectures.

BACKGROUND

Known types of tuners for receiving terrestrially broadcast television signals generally use the single conversion architecture in order to select a desired channel, for example from a received frequency spectrum from 50 to 860 MHz, and to convert this to an output intermediate frequency, for example of 44 MHz. In order to "protect" the desired channel from potentially interfering signals such as the image channel, such tuners typically contain a plurality of tracking filters. Such filters typically comprise or include tracking bandpass filters with a passband center frequency centered on the desired channel. The presence of such filters attenuates many of the undesired channels before a single frequency converter so as to reduce the effects of intermodulation.

In order to cover the whole broadcast spectrum, it is known for such a tuner to comprise three sub-tuners 1, 2 and 3 as shown in FIG. 1 of the accompanying drawings. The sub-tuners 1, 2 and 3 have a common radio frequency (RF) input 4 and a common intermediate frequency (IF) output 5. The tuners 1, 2 and 3 are used for reception in a low band (50 to 170 MHz), a mid band (170 to 440 MHz) and a high band (440 to 860 MHz), respectively. The sub-tuners are of the same construction, a typical example of which is illustrated in FIG. 2 of the accompanying drawings.

The RF input 10 is connected to a first tuneable bandpass filter 11. The filter 11 is of the "single element" type and comprises a single inductor/capacitor resonant network whose center frequency is arranged to track with the frequency of the desired channel which has been selected for reception. The filter 11 thus "selects" the desired channel from the full received frequency spectrum and provides a first attenuation to at least some of the undesired channels, including the image channel. The filter 11 therefore provides protection from intermodulation being generated in the immediately following stage.

In this example, the tuner uses high side mixing such that the frequency of a local oscillator (LO) 12 is above the frequency of the selected channel and differs therefrom by the output intermediate frequency. The image channel is therefore above the selected channel and spaced therefrom by twice the output intermediate frequency.

The output of the filter 11 is supplied to a low noise amplifier/automatic gain control (LNA/AGC) stage 13, which provides a first system variable gain. The output of the stage 13 is supplied to a further tuneable bandpass filter 14. The filter 14 is of dual element type and comprises two resonant networks generally arranged as a double-tuned loosely-coupled arrangement whose center frequency is arranged to track the desired channel frequency. The filter 14 provides further but higher Q attenuation to the undesired channels including the image channel.

The output of the filter 14 is supplied to a mixer 15 forming part of a frequency changer, which also comprises the local oscillator 12 controlled by a phase blocked loop (PLL) synthesizer 16. The IF output of the mixer is supplied via a roofing filter 17 and an amplifier 18 to the output 19 of the tuner. The roofing filter 17 reduces the composite power supplied to the amplifier 18 so as to prevent overload distortion effects.

The synthesizer 16 operates in the well-known way and controls the local oscillator frequency so as to convert a desired channel to the output intermediate frequency. The synthesizer 16 has a control voltage output 20, which is supplied to the local oscillator 12 and also to the frequency control inputs of the filters 11 and 14.

In a typical example of such a known tuner arrangement, the mixer 15, the amplifier 18 and the local oscillator for all three sub-tuners 1, 2 and 3 together with a synthesizer 16 which is common to the three sub-tuners are disposed in a common integrated circuit. The tracking filters 11 and 14 and the stage 13 are formed on a separate substrate for each of the sub-bands and comprise a plurality of discrete components.

The tracking filters 11 and 14 and the local oscillator 12 generally include similar resonant networks formed from varactor diodes and air core inductors in the form of air coils. These networks are arranged such that their resonant frequencies substantially track over the required operating frequency range with a frequency offset equal to the intermediate frequency between the filter networks and the oscillator network. During production, the tracking alignment between the filters 11 and 14 and the oscillator 12 is adjusted for a best compromise across the required frequency range by manual adjustment of the air coils. This typically involves moving the coils closer together or further apart so as to adjust their inductance and hence the characteristic response at a plurality of different frequencies. It is thus possible to provide RF filtering ahead of the frequency changer 12, 15 capable of providing a tracking bandwidth of between 3 and 6 channels and an image cancellation or reduction of typically 55 dB.

A typical example of the single element filter 11 is shown in FIG. 3 of the accompanying drawings. The filter has an RF input 21 connected to a first inductor element 22, which is inductively coupled to a second inductor element 23. A padding and DC blocking capacitor 24 is disposed between ground and the inductor element 23. A varactor diode 25 is connected in parallel with the inductor element 23 to form a parallel resonant circuit. The resonant circuit is connected to the output 26 of the filter via a DC blocking capacitor 27. The capacitance of the varactor diode 25, and hence the resonant frequency of the parallel resonant circuit, is controlled by a control voltage Vvar supplied to the diode 25 via an isolating resistor 28.

Following assembly, the filter 11 is aligned during a manual or semi-automatic alignment step. In particular, the inductive coupling between the first and second elements 22 and 23 is adjusted and the inductances of the elements 22 and 23 is adjusted so as to optimize the coupling frequency range and so as to align the frequency versus voltage characteristic in order for the filter 11 to track optimally with the local oscillator.

FIG. 4 of the accompanying drawings illustrates an example of the dual element filter 14. The filter has an RF input 30 connected via a coupling capacitor 31 to a parallel resonant circuit comprising an inductor element 32, a padding and DC blocking capacitor 33 and a varactor diode 34. The element 32 is inductively coupled to an inductor element 35 forming part of a parallel resonant circuit comprising a padding and DC blocking capacitor 36 and another varactor diode 37. The second resonant circuit is connected to the output 38 of the filter via a coupling capacitor 39. The frequency control voltage Vvar is supplied to the diodes 34 and 37 via isolating resistors 40 and 41, respectively.

The filter 14 is also subjected to an alignment procedure towards the end of manufacture. Again, the coupling between the inductor elements 32 and 35 and the inductance values of the elements 32 and 35 are adjusted so as to optimize the frequency verses voltage characteristic for tracking with the local oscillator. Further, the coupling is optimized so as to maximize the passband flatness provided by the double-tuned resonant network.

For tuners of the type shown in FIG. 1, each of the sub-tuners contains examples of the filters 11 and 14 with each filter being optimized for the desired frequency range of operation. In practice, the values of the inductor elements in the filters may range from a few hundred nano Henries (nHs) in the low band sub-tuner 1 to a few nHs in the high band sub-tuner 3. These inductor elements are characterized by high Q factors, for example in excess of 50. The Q factors of the inductor elements and of the varactor diodes are important as they determine the ratio of passband to resonant frequency and hence the attenuation ratio provided between the center of the passband and offset frequencies.

Such filters 11 and 14 typically have a tuning range in excess of one octave. This is achieved through the capacitance range of the varactor diodes 25, 34 and 37, which typically provide a ratio of 12:1 between their maximum and minimum capacitances.

Such filters are not suitable for integration, for example in an integrated circuit. In particular, the inductance values for the low band are too large to be practically implemented. Also, the total composite inductance is too large to be practically implemented. Further, the Q factor of integrated circuit inductors is significantly lower than for air coils and integrated inductors cannot be manually adjusted so as to align more than one resonant network. Because of the planar nature of integrated circuits, it is not practical to form inductively coupled arrangements which can be manually or electronically adjusted. Integrated circuit varactor diodes have a significantly smaller capacitance ratio than discrete varactor diodes and cannot support the relatively high voltages which are typically required to achieve a sufficiently large tuning range. Also, integrated circuit varactors diodes have a lower Q factor than discrete varactor diodes and this, combined with the limited Q factor of integrated circuit inductors, limits the filtering performance which can be achieved. Thus, it is not practical to integrate fully a single conversion tuner of the type illustrated in FIGS. 1 to 4.

SUMMARY

According to the invention, there is provided a radio frequency tuner comprising at least one frequency changer, at least one tracking radio frequency filter ahead of the at least one frequency changer, and a controller having a filter alignment mode and a reception mode, the at least one filter having at least one resonant network comprising an inductance and a plurality of capacitances which are independently switchable into the network for selecting the resonant frequency thereof, the controller being arranged, during the alignment mode, to determine the difference between nominal and actual capacitances for achieving a known resonant frequency and, during the reception mode, to use the difference to reduce tuning error in the at least one filter.

The inductance may comprise a fixed inductance.

The plurality of capacitances may comprise a binary-weighted capacitor network controlled by a first electronic switching arrangement.

The capacitances may be arranged such that the ratios between the values of the capacitances are substantially unaffected by process and temperature variation.

The tuner may comprise a test tone generator arranged to be controlled by the controller for supplying a test tone to the at least one filter during the alignment mode and a level detector for detecting the level of a signal filtered by the at least one filter.

The controller may be arranged, during the alignment mode, to cause the generator to generate a test tone of a predetermined frequency, to switch into the network a first combination of the capacitances representing a nominal capacitance for tuning the network to the predetermined frequency, to vary the combination of switched capacitances while monitoring the output of the level detector until a maximum level is detected for a second combination of the capacitances, and to form the difference from the difference between the total capacitances represented by the first and second combinations.

The controller may be arranged, during the alignment mode, to switch into the network a predetermined combination of the capacitances for nominally tuning the network to a first predetermined frequency, to cause the generator to generate a test tone at the first frequency, to vary the test tone frequency while monitoring the output of the level detector until a maximum level is detected at a second test tone frequency, and to derive the difference from the difference between the first and second frequencies.

The controller may be arranged, during the alignment mode, to connect the at least one network into a frequency-locked loop for determining the difference. The controller may be arranged, during the alignment mode, to switch into the network a first combination of the capacitances representing a nominal capacitance for tuning the network to a predetermined frequency, to vary the combination of switched capacitances until a second combination is found for which the output frequency of the frequency-locked loop is substantially equal to the predetermined frequency, and to form the difference from the difference between the total capacitances represented by the first and second combinations.

The at least one resonant network may comprise a plurality of damping resistances which are independently switchable into the network for selecting the Q factor thereof. The plurality of resistances may comprise a binary-weighted resistor network controlled by a second electronic switching arrangement.

The controller may be arranged, during a subsequent part of the alignment mode, to compare the outputs of the level detector for two different test tone frequencies and to derive therefrom a damping resistance correction for use during the reception mode. The controller may be arranged to set the network resonant frequency to one of the two test tone frequencies during the subsequent part of the alignment mode.

The controller may be arranged, during a subsequent part of the alignment mode, to compare the outputs of the level detector for two different network resonant frequencies in response to the same test tone frequency and to derive therefrom a damping resistance correction for use during the reception mode.

The controller may be arranged to perform the alignment mode at switch-on of the tuner.

The controller may be arranged to perform the alignment mode repeatedly.

The at least one frequency changer may comprise a single frequency changer.

The tuner may comprise a single monolithic integrated circuit.

The tuner may comprise a terrestrial television tuner.

It is thus possible to provide a tuner which is capable of being manufactured with a higher degree of integration. It is possible to manufacture such a tuner without a manual alignment procedure. A wide tuning range may be provided without the need to support high voltages.

DETAILED DESCRIPTION

The tuner described hereinafter is of the single conversion type and has the architecture illustrated in FIG. 2. Consequently, the architecture will not be described again in detail. However, the tuner may be of other architectures and may be of the zero intermediate frequency (ZIF), near zero intermediate frequency (NZIF), low intermediate frequency (IF), or "classic" IF type.

Figure 5:
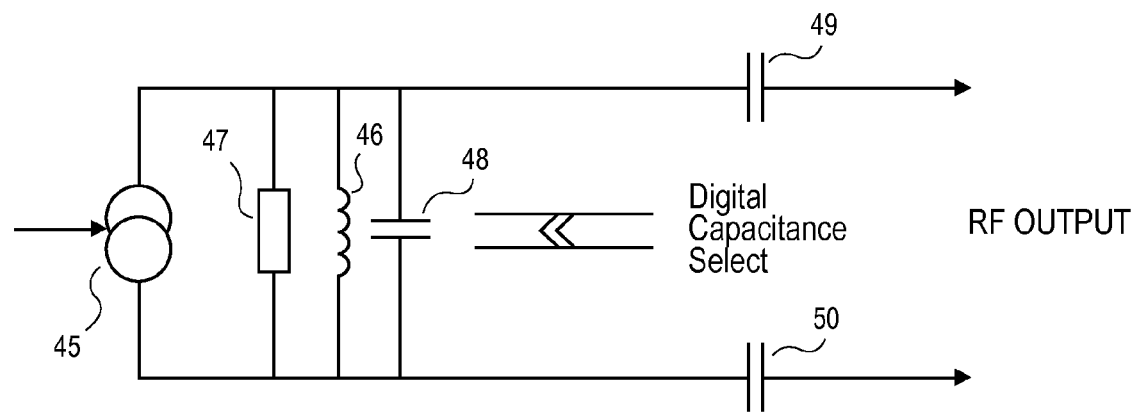
FIG. 5 is a schematic circuit diagram illustrating part of a tuner constituting an embodiment of the invention.

The filter illustrated schematically in FIG. 5 is of the single element bandpass type with the preceding stage being illustrated as a current source 45. The filter comprises a parallel resonant network comprising a fixed inductor 46, a damping resistor 47 for determining the Q factor, and a switched binary-weighted capacitor network illustrated diagrammatically at 48. The filtered signal is coupled to the filter output by coupling capacitors 49 and 50.

In order to tune such a filter, digital signals are supplied to electronic switches controlling which of the binary-weighted capacitors are connected in circuit parallel to the inductor 46. Thus, the resonant frequency is tuned in discrete steps but the steps may be sufficiently fine compared with the passband of the filter to allow the filter to be tuned so as to pass any desired channel while providing a required amount of attenuation outside the passband. Similarly, the value of the resistor 47 is selected in response to a digital control signal controlling electronic switches forming part of a binary-weighted resistor network. The Q factor of the filter may therefore be selected to a value providing an acceptably flat passband while providing sufficient attenuation to potentially interfering out-of-band signals.

The filter thus comprises one (or more) fixed inductor 46 which may readily be formed in an integrated circuit. The capacitors of the capacitor network 48 are arranged, for example by the appropriate layout design, to track each other accurately over process and temperature spreads or variations. Similarly, the resistors of the network are arranged to track each other over process and temperature variations. Thus, the ratios of the values of the capacitors, and likewise of the resistors, remain substantially fixed irrespective of tolerances and variations which occur during the manufacturing process and temperature variations which occur during use of the tuner. However, the actual values of the individual resistors and capacitors vary as a result of manufacturing spreads and temperature variations so that an alignment procedure is required.

Figure 1:
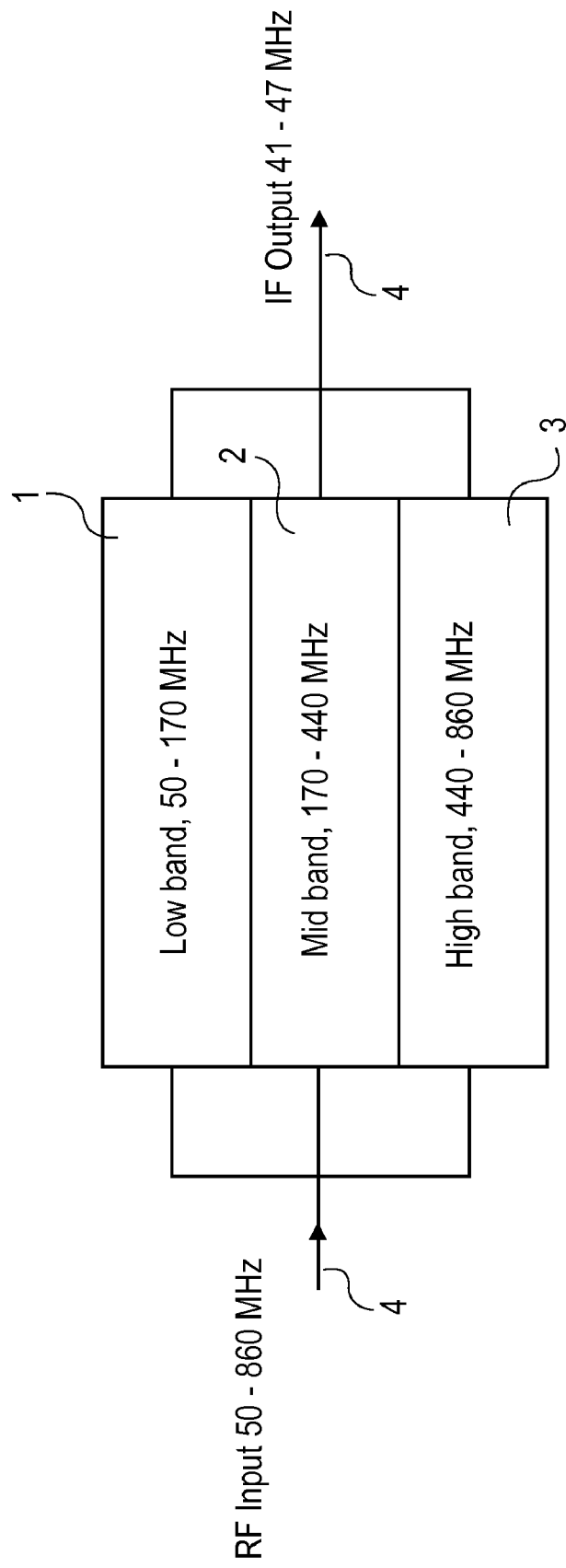
FIG. 1 is a block schematic diagram of a known type of radio frequency tuner.
Figure 2:
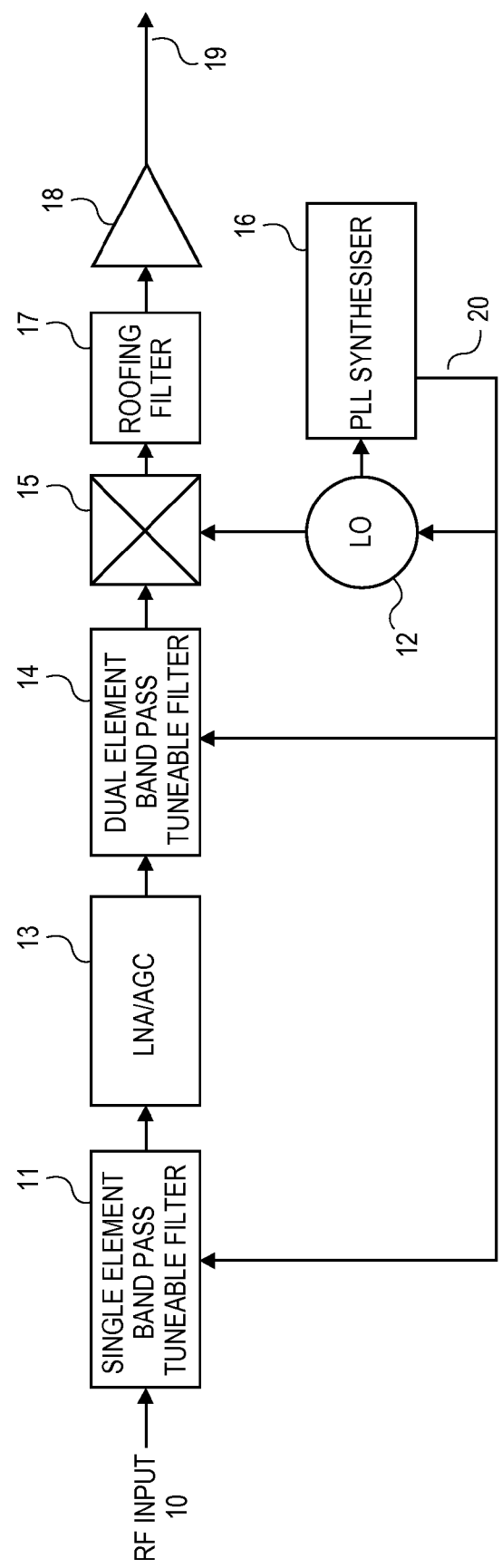
FIG. 2 is a block circuit diagram of one of the sub-tuners shown in FIG. 1.
Figure 3:
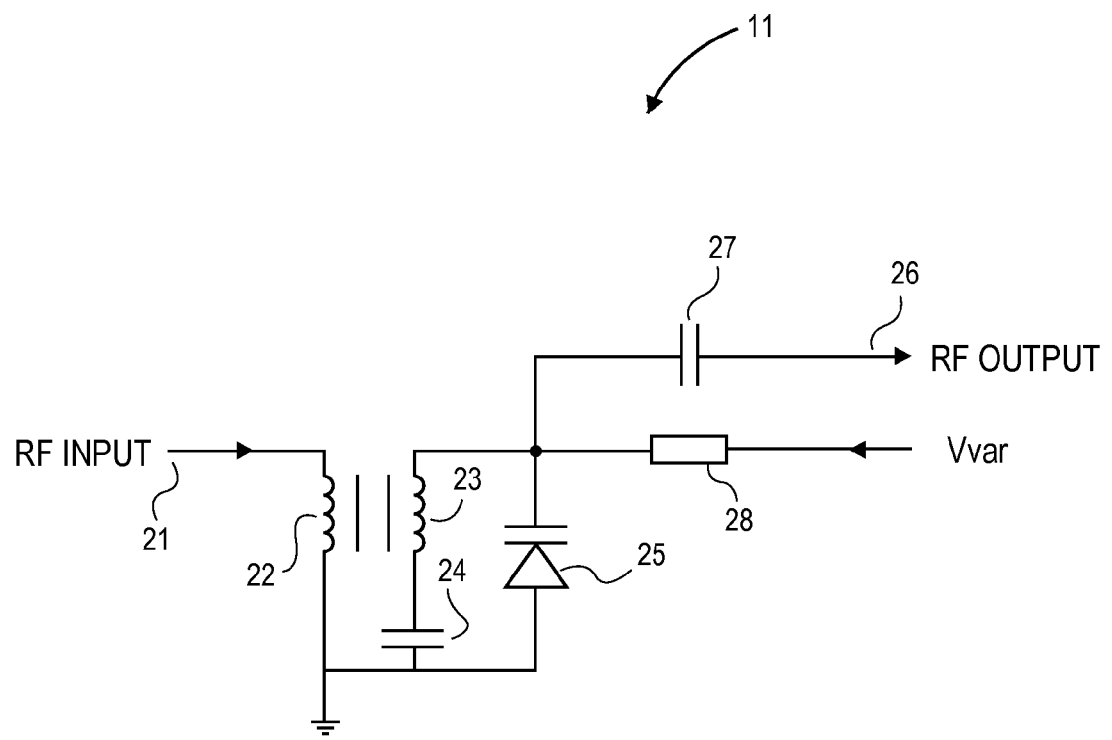
FIGS. 3 and 4 are circuit diagrams of filters of the tuner of FIG. 2.
Figure 4:
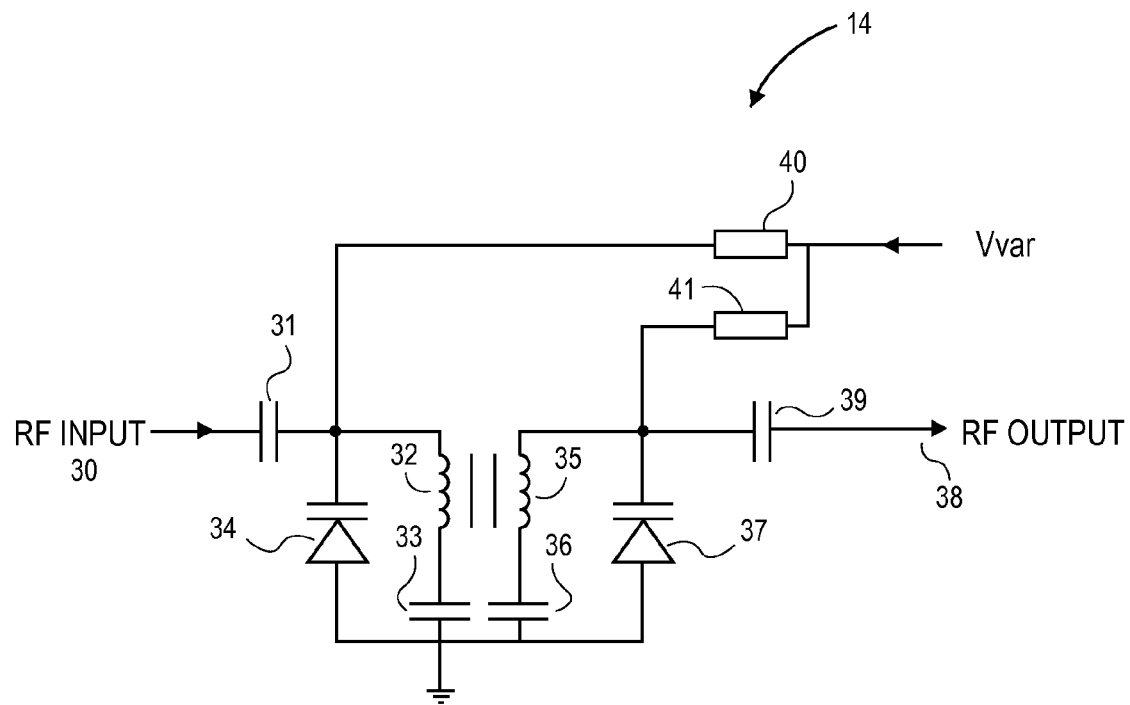
Figure 6:
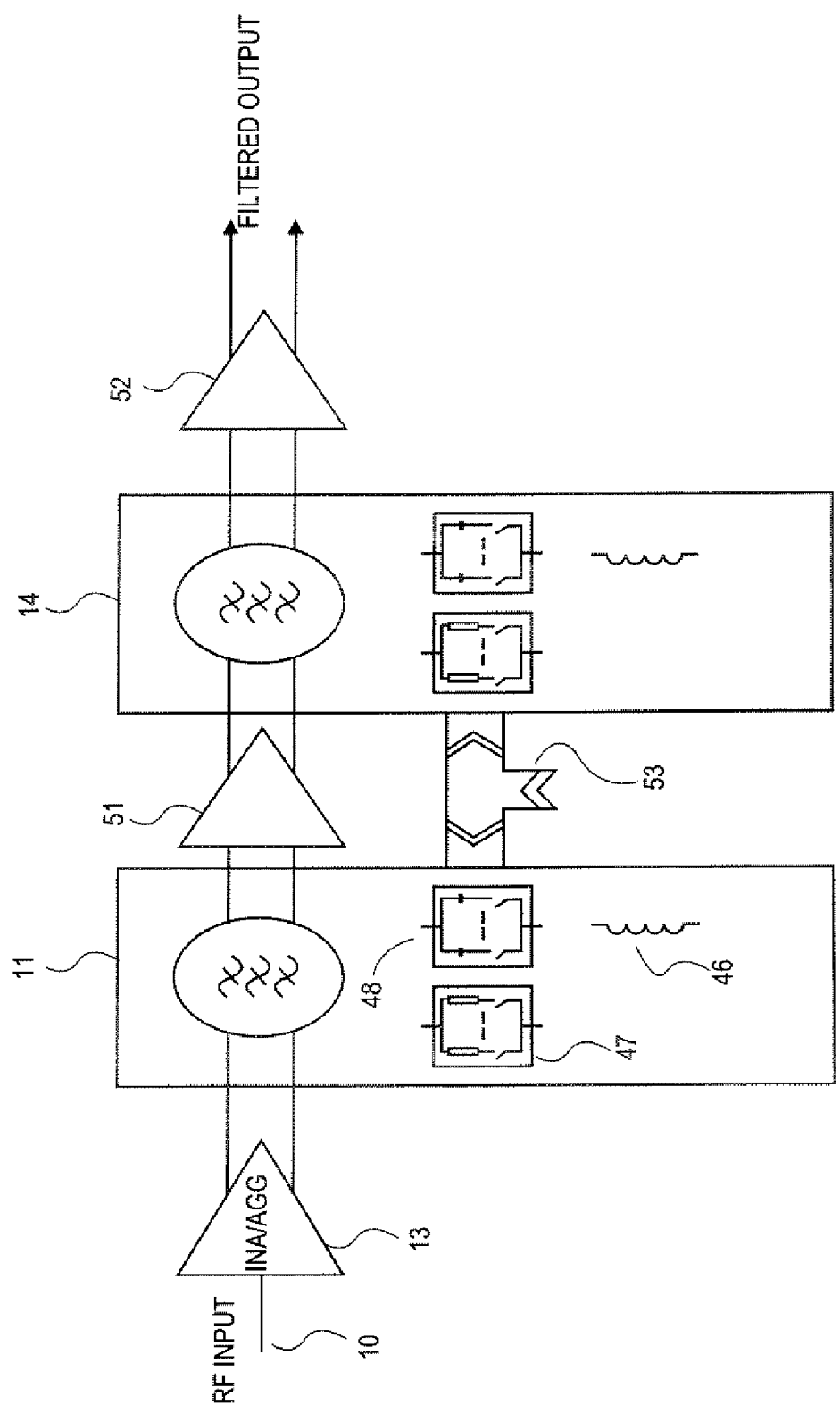
FIG. 6 is a block circuit diagram of the radio frequency stages of a tuner constituting an embodiment of the invention.

FIG. 6 illustrates the RF front end of a tuner of the type shown in FIG. 2 and comprising an RF input 10, an LNA/AGC stage 13, tuneable bandpass filters 11 and 14, and buffer stages 51 and 52. The filters 11 and 14 are illustrated schematically as single element filters but either or both could have more than one element in the form of a resonant circuit. Tuning and damping or Q factor are controlled by control signals supplied on a digital bus 53.

Figure 7:
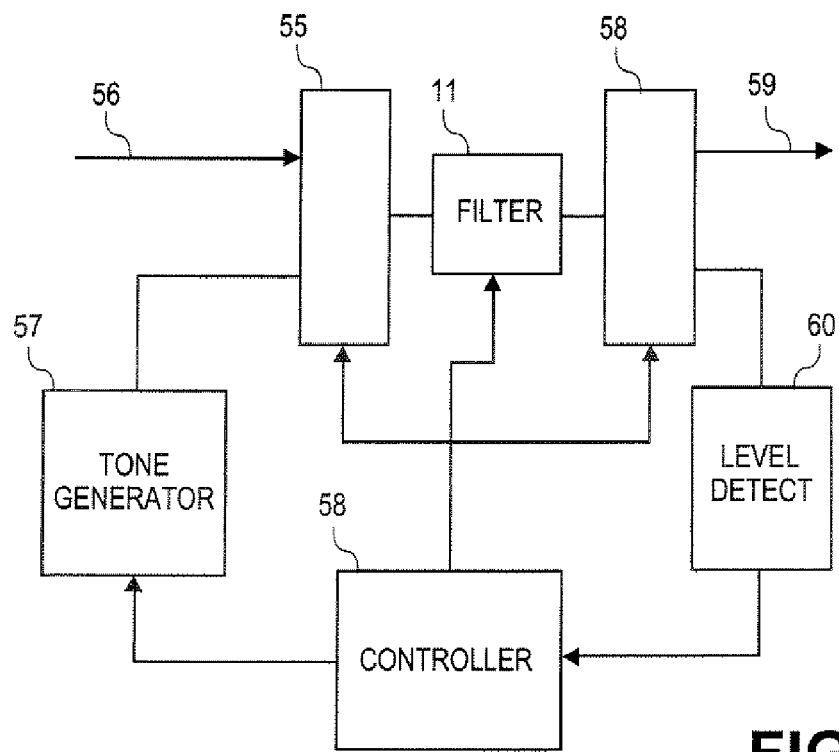
FIG. 7 is a block circuit diagram of part of a tuner constituting an embodiment of the invention.

FIG. 7 illustrates the additional stages required to perform alignment of each of the filters, for example the filter 11. The input of the filter 11 is connected to an electronic changeover switch 55 which selects between the normal filter input 56 and the output of a test tone generator 57 controlled by a controller 58, which may form part of a system controller for controlling the operation of the tuner or may comprise a separate stage. The output of the filter 11 is connected to another electronic changeover switch 58 which switches between the normal filter output 59 and a level detector 60, whose output is supplied to the controller 58. The controller 58 controls the switches 55 and 58 and, at least during an alignment mode of operation, controls the switching of capacitors and damping resistors in the filter 11. During normal reception operation, the input and output of the filter 11 are connected to the input 56 and the output 59, respectively. During the alignment mode, the input of the filter 11 is connected by the switch 55 to the output of the tone generator 57 and the output of the filter 11 is connected by the switch 58 to the input of the level detector 60.

In a first example of the alignment mode, the controller 58 enables the tone generator 57 and causes it to generate a test tone at a known frequency. The nominal or intended values of the or each inductor and each capacitor in the capacitor network are known and the controller 58 selects the combination of capacitors which, together with the inductor, should center the passband on the frequency of the tone generated by the generator 57. The output amplitude or level from the filter 11 is detected by the detector 60 and stored in the controller 58.

The capacitance is then changed by selecting a different combination of capacitors for the network for resonating with the inductor and the resulting amplitude is measured and compared with the previously measured amplitude. If the second amplitude is greater than the first amplitude, then the total capacitance is stepped in the same direction and the process repeated. Conversely, if the second amplitude is less than the first amplitude, the total capacitance in the resonant network of the filter 11 is changed in the opposite direction. This procedure is then repeated until the difference between consecutive amplitude measurements fulfils a predetermined criterion. For example, the criterion may be that the change in amplitude is less than a predetermined threshold. As an alternative, the criterion may be that the sign of the change in amplitude changes. This criterion effectively corresponds to the actual resonant frequency of the filter network being substantially equal to the theoretical or nominal value corresponding to the initial capacitance in the alignment mode.

The difference between the capacitances corresponding to the start and end of the alignment mode provides a measure of the error in the actual values of the capacitors of the network. The error in the "unit value", or the smallest capacitor in the binary-weighted network, can thus easily be derived and this is then used as a correction term during subsequent reception operation of the tuner so as to correct for mistuning of the filter 11 resulting from manufacturing spread and/or temperature variations.

The alignment procedure may be repeated for one or more test tones of different frequencies and the resulting correction terms may be averaged in order to provide a more accurate correction during reception operation of the tuner. By repeating the alignment procedure and averaging the correction terms, errors such as those resulting from the actual measurement technique can be reduced.

Once the alignment has been performed in respect of the capacitor network, a similar alignment may be performed in respect of the resistor network. In this case, the resonant frequency or passband center of the filter 11 is set so as to be equal to the output frequency of the tone generator 57 and the level detected by the detector 60 is stored. The tone generator 57 is then controlled to provide a test tone at a different frequency (but of the same amplitude) and the detected level is compared with the previously measured level. This measurement is performed for a first combination of resistors connected into the filter resonant circuit as a damping resistance.

The difference in amplitude is related to the Q factor of the filter 11 so that the actual damping resistance can be aligned by determining a correction factor, which is applied during normal reception by the tuner to achieve the desired passband flatness and out-of-band attenuation throughout the frequency range of the filter 11.

In an alternative alignment mode, the resonant frequency of the filter 11 remains fixed throughout and the frequency of the tone generator 57 is varied until it coincides with the actual resonant frequency. This may be achieved by incrementing and/or decrementing the tone generator frequency while monitoring the resulting output level for a maximum value.

The actual resonant frequency of the network in the filter 11 can thus be determined and an appropriate capacitance correction can be determined for use during normal reception.

In a further example of an alignment mode, the resonant network of the filter 11 is switched into a frequency locked loop so as to act as the frequency determining element in a local oscillator. The local oscillator frequency may be measured or the capacitance in the resonant network may be varied so that the oscillator frequency is equal to a predetermined value. In either case, the capacitance error or correction value can be determined from the measurement.

These techniques for aligning a filter of a tuner and of tuning such a tracking filter may be applied to other types of filters. For example, these techniques may be applied to a filter arrangement for providing impedance transformation such that voltage gain is provided between the input and output terminals.

Figure 8:
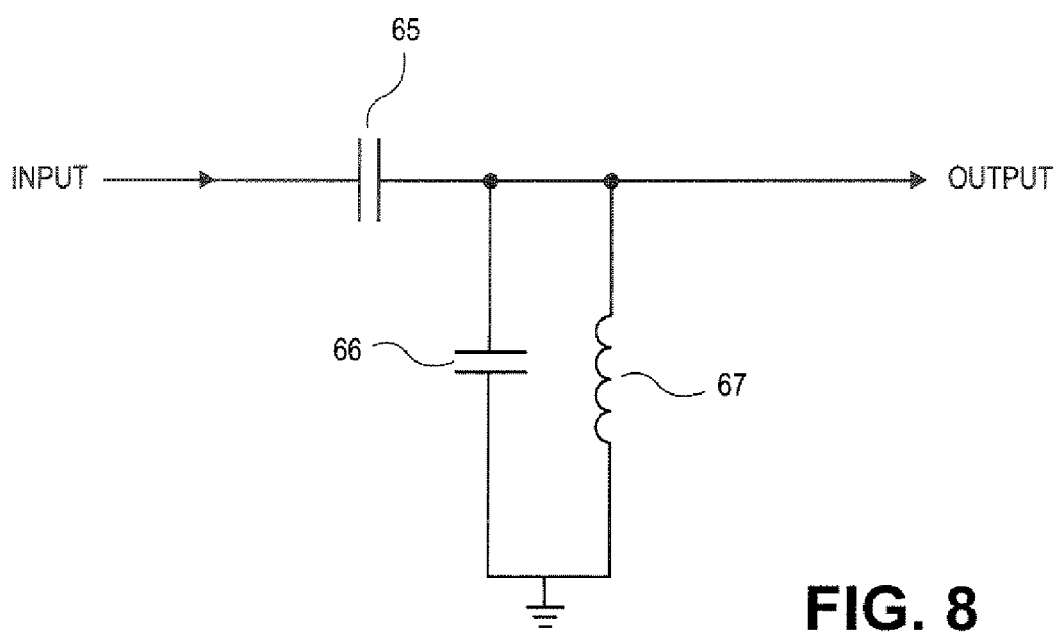
FIG. 8 is a schematic circuit diagram of another type of filter which may be used in a tuner constituting an embodiment of the invention.

Another filter is shown in FIG. 8. The filter has an input connected to an output by a capacitor 65, which may be embodied by a switched capacitor network of the type described hereinbefore. The output terminal is connected to ground via a parallel resonant circuit comprising a capacitor 66 and an inductor 67. The capacitor 66 is embodied by a switched capacitor network of the type described hereinbefore.

Such a filter arrangement may be configured to maximize the attenuation depending on the selected frequency. For example, when tuning to lower frequencies, it is desirable to provide more rapid attenuation to increasing frequencies above the filter passband. Conversely, when tuning to higher frequencies, it is desirable to provide more rapid attenuation to decreasing frequencies where there will be more channels present. The filter shown in FIG. 8 is suitable, for example, for operation at higher frequencies. Such an arrangement has a lower insertion loss and a more rapid attenuation to lower frequencies than a simple inductance/capacitance parallel network.

It is thus possible to provide an arrangement which allows a tracking filter to be implemented in an integrated circuit. Non-aligned inductors may be used and alignment may be performed by digitally adjusting the capacitance values, from which a correction or adjustment value can be determined. A relatively wide tuning range can be achieved because the switched capacitor network can easily be arranged to provide a wide capacitance range. For example, such a range may be larger than that achievable by a varactor diode. By using a switched resistance network to determine the Q factor, a substantially optimum transfer characteristic may be achieved throughout the tuning range. The relatively wide tuning range may be achieved without requiring any special supply voltage. Thus, for example, the relatively large supply voltage required for a varactor diode is unnecessary.

What is claimed is:

1. A radio frequency tuner comprising at least one tracking radio frequency filter ahead of at least one frequency changer, and a controller having a filter alignment mode and reception mode, said at least one filter having at least one resonant network comprising an inductance and a plurality of capacitances which are independently switchable into said network for selecting a resonant frequency thereof, said controller being arranged, during said alignment mode, to determine a difference between an amplitude of a first combination of capacitors and an amplitude of a second combination of capacitors for achieving a known resonant frequency and, during said reception mode, to use said difference to reduce a tuning error in said at least one filter.

2. A tuner as claimed in claim 1, in which said inductance comprises a fixed inductance.

3. A tuner as claimed in claim 1, comprising a first electronic switching arrangement and in which said plurality of capacitances comprises a binary-weighted capacitor network controlled by said first electronic switching arrangement.

4. A tuner as claimed in claim 1, in which said capacitances are arranged such that ratios between values of said capacitances are substantially unaffected by process and temperature variations.

5. A tuner as claimed in claim 1, comprising a test tone generator arranged to be controlled by said controller for supplying a test tone to said at least one filter during said alignment mode and a level detector for detecting a level of a signal filtered by said at least one filter.

6. A tuner as claimed in claim 5, in which said controller is arranged, during said alignment mode, to cause said generator to generate said test tone of a predetermined frequency, to switch into said network a first combination of said capacitances representing a nominal capacitance for tuning said network to said predetermined frequency, to vary said first combination of said capacitances while monitoring an output of said level detector until a maximum level is detected for a second combination of said capacitances, and to form said difference from a difference between total capacitances represented by said first and second combinations.

7. A tuner as claimed in claim 5, in which said controller is arranged, during said alignment mode, to switch into said network a predetermined combination of said capacitances for nominally tuning said network to a first predetermined frequency, to cause said generator to generate said test tone at said first predetermined frequency, to vary a frequency of said test tone while monitoring an output of said level detector until a maximum level is detected at a second test tone frequency, and to derive said difference from a difference between said first and second frequencies.

8. A tuner as claimed in claim 1, comprising a frequency-locked loop and in which said controller is arranged, during said alignment mode, to connect said at least one network into said frequency-locked loop for determining said difference.

9. A tuner as claimed in claim 8, in which said controller is arranged, during said alignment mode, to switch into said at least one network a first combination of said capacitances representing a nominal capacitance for tuning said network to a predetermined frequency, to vary said first combination of said capacitances until a second combination is found for which an output frequency of said frequency-locked loop is substantially equal to said predetermined frequency, and to form said difference from a difference between total capacitances represented by said first and second combinations.

10. A tuner as claimed in claim 1, in which said at least one resonant network comprises a plurality of damping resistances which are independently switchable into said network for selecting a Q factor thereof.

11. A tuner as claimed in claim 10, comprising a second electronic switching arrangement and in which said plurality of resistances comprises a binary-weighted resistor network controlled by said second electronic switching arrangement.

12. A tuner as claimed in claim 10, comprising a test tone generator arranged to be controlled by said controller for supplying a test tone to said at least one filter during said alignment mode and a level detector for detecting a level of a signal filtered by said at least one filter, said controller being arranged, during a subsequent part of said alignment mode, to compare outputs of said level detector for two different test tone frequencies and to derive therefrom a damping resistance correction for use during said reception mode.

13. A tuner as claimed in claim 12, in which said controller is arranged to set a network resonant frequency to one of said two test tone frequencies during said subsequent part of said alignment mode.

14. A tuner as claimed in claim 10, comprising a test tone generator arranged to be controlled by said controller for supplying a test tone to said at least one filter during said alignment mode and a level detector for detecting a level of a signal filtered by said at least one filter said controller being arranged, during a subsequent part of said alignment mode, to compare outputs of said level detector for two different network resonant frequencies in response to a same test tone frequency and to derive therefrom a damping resistance correction for use during said reception mode.

15. A tuner as claimed in claim 1, in which said controller is arranged to perform said alignment mode at a switch-on of the tuner.

16. A tuner as claimed in claim 1, in which said controller is arranged to perform said alignment mode repeatedly.

17. A tuner as claimed in claim 1, comprising a single monolithic integrated circuit.

18. A tuner as claimed in claim 1, comprising a terrestrial television tuner.

\* \* \* \* \*

UNITED STATES PATENT AND TRADEMARK OFFICE
CERTIFICATE OF CORRECTION

| | | |
|---|---|---|
| PATENT NO. | : 7,620,379 B2 | Page 1 of 1 |
| APPLICATION NO. | : 11/439537 | |
| DATED | : November 17, 2009 | |
| INVENTOR(S) | : Isaac et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 515 days.

Signed and Sealed this

Twenty-sixth Day of October, 2010

David J. Kappos
*Director of the United States Patent and Trademark Office*